United States Patent
Ho et al.

(10) Patent No.: US 7,079,575 B2
(45) Date of Patent: Jul. 18, 2006

(54) EQUALIZATION FOR CROSSPOINT SWITCHES

(76) Inventors: Peter Ho, 4723 Andrea Way, Union City, CA (US) 94587; Benny W. H. Lai, 47305 Galindo Dr., Fremont, CA (US) 94539

( * ) Notice: Subject to any disclaimer, the term of this patent is extended or adjusted under 35 U.S.C. 154(b) by 794 days.

(21) Appl. No.: 10/066,019

(22) Filed: Jan. 30, 2002

(65) Prior Publication Data

US 2003/0142738 A1 Jul. 31, 2003

(51) Int. Cl.
*H04L 27/01* (2006.01)
(52) U.S. Cl. .................. 375/232; 375/230; 375/371
(58) Field of Classification Search .......... 375/229, 375/232, 230
See application file for complete search history.

(56) References Cited

U.S. PATENT DOCUMENTS

| 4,727,578 | A | | 2/1988 | Molnar |
| 5,757,652 | A | * | 5/1998 | Blazo et al. .............. 702/69 |
| 6,005,892 | A | | 12/1999 | Yiu |
| 6,104,750 | A | * | 8/2000 | Yiu .......................... 375/229 |
| 6,137,832 | A | | 10/2000 | Lin et al. |
| 6,236,524 | B1 | | 5/2001 | Gregoire et al. |
| 6,331,999 | B1 | * | 12/2001 | Ducaroir et al. ........... 375/226 |
| 2002/0020905 | A1 | * | 2/2002 | McCormack et al. ...... 257/686 |
| 2003/0108137 | A1 | * | 6/2003 | Li et al. .................... 375/371 |

OTHER PUBLICATIONS

Lai, Benny, et al., "A Monolithic 622Mb/s Clock Extraction Data Retiming Circuit," 1991 IEEE International Solid-State Circuits Conference, 91CH2960-3/91/0000-0144, 1991.
Shakiba, Mohammad Hossein, "A 2.5Gb/s Adaptive Cable Equalizer," 1999 IEEE International Solid-State Circuits Conference, 0-7803-5126-6/99, 1999.
Yen, Chu-Sun, et al., "Distribution and Equalization of Signal on Coaxial Cables Used in 10 Mbit/s Baseband Local Area Networks," IEEE Transactions on Communications, vol. COM-31, No. 10, Oct. 1983.

* cited by examiner

Primary Examiner—Jay K. Patel
Assistant Examiner—Juan Alberto Torres

(57) ABSTRACT

Equalization for ports of a crosspoint switch at least partially offsets transmission losses such as skin loss. The equalization may be tailored on a port-by-port basis using adaptive equalization or adjustable equalization, but fixed equalization may be used. In some implementations, each input port or output port of a crosspoint switch has a dedicated equalization circuit that has filtering characteristics that are based on the signal characteristics (e.g., jitter) measured at the affected output port. For an adjustable equalization approach, the adjustable equalization circuitry includes various switched connections that are selectively coupled and decoupled to achieve the target level of equalization.

13 Claims, 12 Drawing Sheets

EQUALIZATION FOR CROSSPOINT SWITCHES

TECHNICAL FIELD

The invention relates generally to equalization circuits and more particularly to providing compensation for the effects of "skin loss" for circuits such as crosspoint switches.

BACKGROUND ART

A crosspoint switch may be used to dynamically connect any one of a number of input channels to any one or more of a number of output channels. The crosspoint switch may be a single integrated circuit chip having an array of input ports and an array of output ports. For example, there may be 68 input ports and 68 output ports. Each output port has a dedicated multiplexer which is linked to all of the input ports, so that an incoming signal at an input port can be routed to a selected output port, a group of selected output ports, or all of the output ports. The routing of the signals by the crosspoint switch multiplexers is controlled by operations of address registers. In the example in which there are 68 input ports, the crosspoint switch will have 68 address registers or register pairs, since there is an address register dedicated to each multiplexer.

In order to increase the routing capability of a system, a printed circuit board may include an array of integrated circuit chips that house identical crosspoint switches. Thus, one of the chips may have its output ports connected to input ports of a second-stage crosspoint switch. The number of stages will depend upon the needs of the system supported by the crosspoint switches.

One concern in the routing of signals using wired transmission lines or conductive traces along a printed circuit board is that the signals will encounter "skin loss," which is defined herein as the attenuation of high frequency components as a signal travels along a transmission path. That is, the low frequency components of a signal are transmitted more efficiently than the high frequency components of the same signal. The effects of skin loss vary as a function of the type of transmission medium (e.g., a copper trace along a printed circuit board), the length of the transmission path, and other properties (such as the width of the transmission path). Consequently, skin loss varies among different transmission paths. If the effects of skin loss are significant, signal integrity is jeopardized.

What is needed is an approach for effectively addressing skin loss and other signal losses that vary significantly on a channel-by-channel basis, so that the integrity of signals conducted via different channels of a system is preserved.

SUMMARY OF THE INVENTION

Adverse effects of skin loss and similar frequency-dependent variables on the integrated circuit (IC) chip performance of a crosspoint switch are offset by providing equalization for the various ports of the crosspoint switch. Typically, the equalization is achieved by integrating the necessary circuitry into the same IC chip as the switching matrix of the crosspoint switch. Four equalization approaches are contemplated. In a first approach, a separate user-adjustable equalization circuit is provided for each input port or output port of the switch. The second approach provides adaptive equalization. The third and fourth approaches utilize fixed equalization, with the difference between the two being with respect to whether the same level of equalization is provided for each port or whether the level of equalization is tailored on a channel-by-channel basis to achieve targets that are based upon the signal characteristics (e.g., jitter) for the channel.

Channel-by-channel tailoring of the equalization provides advantages over the uniform equalization approach. Each input port or output port of a crosspoint switch has a dedicated equalization circuit that has filtering characteristics which are set on the basis of measured signal characteristics. Typically, the equalization is provided at the input ports, but the first step is to measure the jitter at connected output ports and the second step is to tailor the filtering characteristics of the different equalization circuits to minimize the jitter at the output ports.

In the adjustable equalization approach, the conventional circuitry of a port may be coupled to on-chip adjustable equalization circuitry having a number of available fixed levels of frequency-dependent equalization. On a basis of anticipated transmission loss along an input or output, a target level of equalization is achieved by selectively activating and deactivating switched connections in which each switched connection includes at least one circuit component that varies the frequency-dependent equalization. For example, each switched connection may include a switching transistor and a resistive, capacitive, or inductive component. The equalized circuit may be provided at each input channel of a crosspoint switch, but may also be used in other applications.

For the embodiment in which a crosspoint switch is formed as a single integrated circuit chip, the chip is often connected to a printed circuit board, so that each channel has known and constant characteristics. As a result, the frequency-dependent transmission loss, such as skin loss, encountered by the signals to a particular input port is generally constant. However, the transmission losses among the various input ports may be significantly different. Thus, maintaining the same level of equalization for all channels may result in inadequate equalization for some channels and excessive equalization for others. Both inadequate and excessive equalization result in data-dependent jitter, with greater data rates leading to "eye closure," as is known in the art.

In the adaptive equalization approach, equalization settings are varied automatically, so that less user intervention is required as compared to the adjustable equalization approach. Another advantage is that the level of equalization can track changes in the environment or in the supported hardware. A potential concern is that adaptive equalization typically requires a significant amount of hardware, so that on-chip implementation is difficult. As a solution, an additional multiplexer is used to multiplex the input channels, so that the channels may be considered one at a time. In considering a channel, a bang—bang phase-locked loop (PLL) may be used for jitter measurement. A bang—bang PLL is digital and therefore interfaces easily with other digital circuitry, but linear PLL may be substituted in some applications. The bang—bang PLL tracks the transitions of the incoming data and provides up or down commands to a voltage-controlled oscillator (VCO). In response to the commands, the VCO either speeds up or slows down in order to track the incoming signal. That is, the VCO attempts to align its clock edge with the data transitions. Over time, the VCO clock edge follows the data transitions directed by the up and down commands. As a result, the equalization circuitry can determine the amount of jitter within the incoming signal.

As previously noted, yet another approach to providing equalization tailoring for the different ports of the crosspoint switch is to form different fixed equalized circuits for different ports. However, there are disadvantages to this approach, relative to the use of the adjustable equalization circuitry for each port, where the target level of equalization is predetermined and then the actual level remains fixed during continuous filtering operations. An advantage of the adjustable approach is that the structure of the crosspoint switch does not vary with application. Instead, control signals may be used to activate selected switched connections, while leaving other switched connections inactive. The activating and deactivating of switch connections is carried out for each port.

The switched connections of the adjustable equalization circuitry include a switching component, such as a transistor, that is activated and deactivated by a control signal. By activating a particular switching component, the filtering characteristics of the adjustable equalization circuitry are varied. In one embodiment, the state of a switching component determines whether a resistor or a capacitor is connected within a parallel configuration of resistances and capacitances (a parallel-resonant circuit). In another embodiment, a series configuration of resistances and inductances is formed (a series-resonant circuit), with resistors and inductors being selectively introduced by activation of the switching components.

An advantage of the invention is that the crosspoint switch is less susceptible to errors that might otherwise occur as a result of transmission losses. This is true even in the approach in which the equalization circuits are neither tailored nor distinguishable (i.e., uniformly fixed). Moreover, adjustable equalization circuitry permits variations in equalization that are not available in fixed equalization approaches. Another advantage is that in those approaches that utilize tailoring of the filtering characteristics for each port of a crosspoint switch (i.e., the adaptive approach, the adjustable approach, and the tailored but fixed approach), signal integrity is preserved on an individual basis.

DETAILED DESCRIPTION

Figure 1:
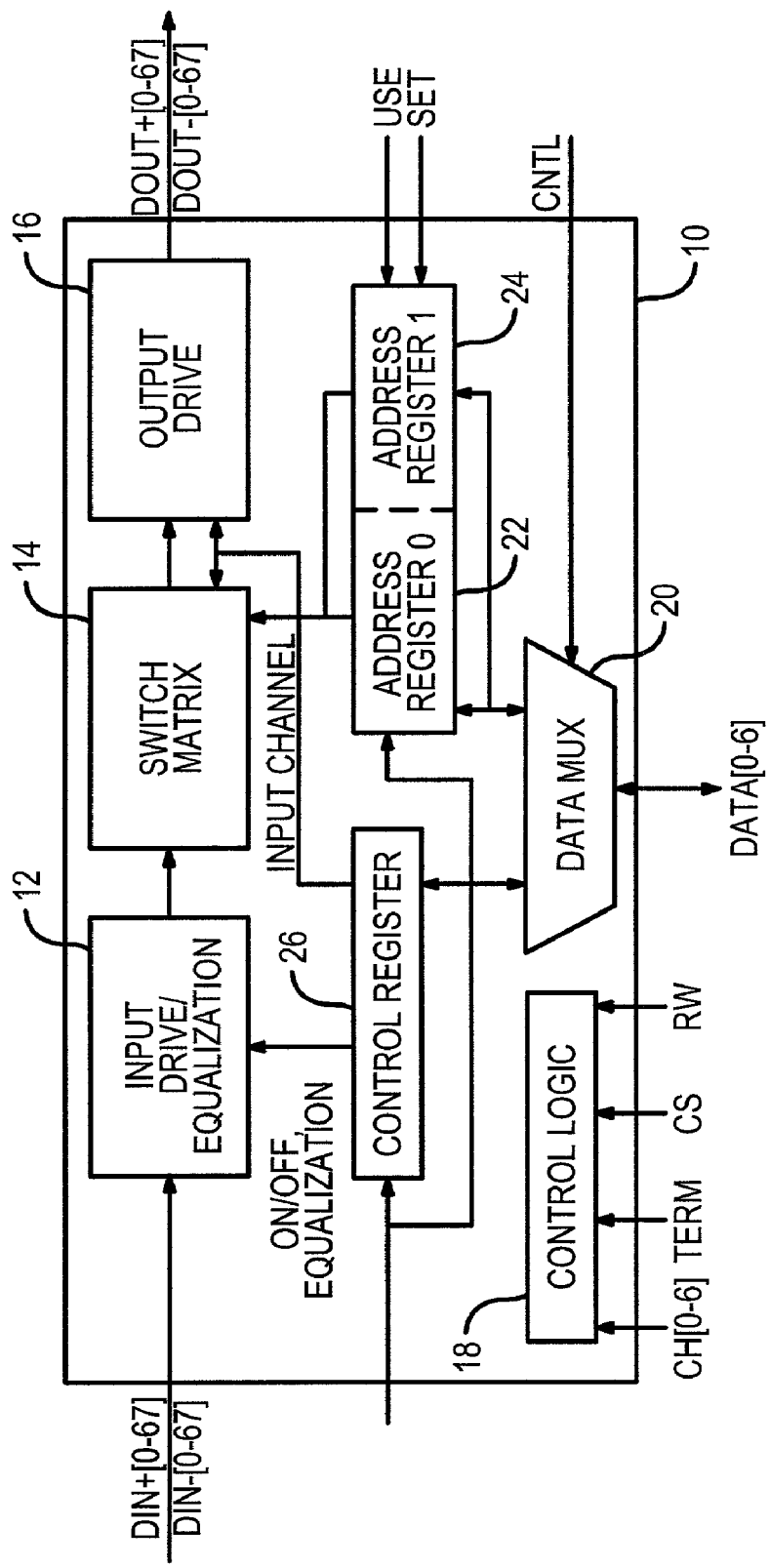
FIG. 1 is a block diagram of a non-blocking crosspoint switch having equalization in accordance with the invention.

With reference to FIG. 1, a block diagram of a digital crosspoint switch 10 is shown as including an input drive/equalization component 12, a switch matrix 14, and an output drive component 16. Within the illustrated example of a crosspoint switch, data enters at each of 68 ports as a differential signal (DIN[0–67]). The border around the components represents the fact that in this embodiment the crosspoint switch is a single integrated circuit (IC). Within the input drive/equalization component 12, there is a separate high speed input buffer and equalization circuit for each of the 68 ports. Similarly, there are 68 multiplexers within the switch matrix 14. The multiplexers allow an input port to be connected to one or more of the output ports. Thus, the crosspoint switch 10 is a non-blocking switch that utilizes 68 fully independent multiplexers to allow each output port (DOUT[0–67]) to be independently programmed to be connected to any input port.

As will be explained more fully below, in three of the four contemplated equalization approaches, the equalization that is provided at the input drive/equalization component 12 is tailored for each input port. As an alternative to FIG. 1, the equalization component 12 may be coupled to the output drive circuitry 16. The tailoring can be based upon the anticipated transmission loss of the corresponding input channel. For example, if the crosspoint switch 10 is electrically connected to a printed circuit board, each input equalization may be tailored to improve signal integrity over the circuit board trace (e.g., copper trace) of the associated input channel. In one approach, the tailoring is provided by fixed equalization circuits that are individually designed during fabrication of the crosspoint switch. However, there are advantages to forming adjustable equalization circuits, which are individually set through the use of program and control pins of the integrated circuit chip in which the crosspoint switch resides. The appropriate program and control pins may include the CH[0–6], CS, and RW pins to a control logic block 18 and DATA[0–6] and CNTL pins to a data multiplexer 20. Pairs of address registers 22 and 24 are also programmed through program and control pins. The final component shown in FIG. 1 is the control register 26. The crosspoint switch address and control register configuration may be read back from the switch through the use of the RW and CNTL inputs.

In addition to the approaches of providing equalization tailoring using individually designed equalization circuits or using adjustable equalization circuits, tailoring may be automatically achieved by using adaptive circuits. The only approach in which the level of equalization is not tailored is the one in which uniformly fixed equalization circuits are employed.

The control register 26 may be used in programming input AC or DC coupling, the input equalization, the output amplitude and the power on/off settings for each input port and each output port of the crosspoint switch 10. The input and output ports should be AC-coupled, unless the ports are connected to a compatible second crosspoint switch or other compatible device. When AC-coupling is used, an AC termination voltage is enabled through the control register. When an input port is intended to be DC-coupled, such as when the input port is connected to an output port of a compatible crosspoint switch, a common mode bias voltage is disconnected from termination resistors that will be described below. Finally, individual input cells can be powered "off" in order to save power when the input cell is not in use.

The address registers 22 and 24 are used to program the connectivity of the switch matrix 14. The address registers are accessed when the CNTL input is low. There are two independent banks of 68 address registers to allow one bank to be programmed while the other bank is controlling the switch matrix, if desired. Each output port is associated with an address0 register from the first bank and an address1 register from the second bank. The address registers select the input to be connected to its output. Connecting a particular input to a particular output is achieved by setting CH[0–6] to the desired output channel. DATA[0–6] holds the channel number of the desired input channel.

Figure 2:
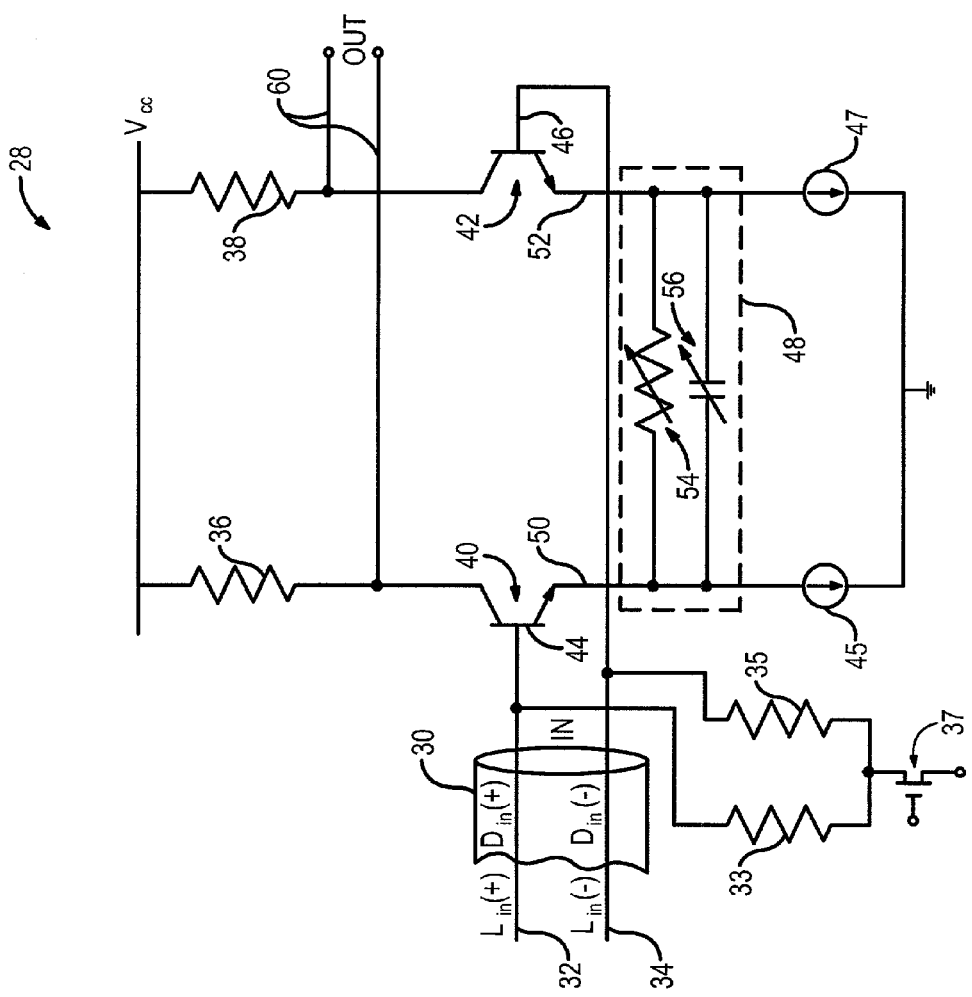
FIG. 2 is a schematic diagram of an equalized input cell of the crosspoint switch of FIG. 1.

Referring now to FIG. 2, a single input cell 28 of the 68 input cells is shown. This input cell utilizes the adjustable equalization approach. Element 30 is a schematic representation of the input port that connects the input channel lines 32 and 34 to the on-chip circuitry. The input channel lines may be copper traces along a printed circuit board. The input cell includes a pair of on-chip termination resistors 33 and 35 that are coupled to a source/drain region of a transistor 37 for enabling or disabling the AC-coupling that was previously described. The resistors may be 50 ohm devices, if the channel lines 32 and 34 are 50 ohm transmission lines. The input cell 28 also includes a differential amplifier formed by a first transistor 40 and a second transistor 42. Each transistor is shown as being an npn bipolar transistor, but the type of transistor is not critical. Differential digital signals $D_{in}(+)$ and $D_{in}(-)$ are coupled to bases of the transistors. As an example of an application, the digital signals coupled to the bases of the transistors may be voice data transmitted at a speed of 3.125 Gbaud. On-chip load resistors 36 and 38 are connected between the collectors of the transistors and a fixed voltage, such as $V_{cc}$. The emitters of the transistors are connected to current sources 44 and 46 which provide a steady bias current for operation of the input cell.

The two transistors 40 and 42 of the differential amplifier provide the drive circuitry for the input cell 28. A representation of tailored equalization circuitry 48 is shown connected to the emitters 50 and 52 of the transistors. The tailored equalization circuitry is shown as including an adjustable resistance 54 and an adjustable capacitance 56. In accordance with the invention, the anticipated transmission losses experienced by signals received via input channel lines 32 and 34 are determined, so that the equalization circuitry 48 may be set to compensate for the losses. For example, if the transmission loss of concern is skin loss at the high frequency end of a desired bandwidth, the equalization circuitry 48 should be set to provide an inverse transfer function. That is, the resistance 54 and the capacitance 56 should be set to provide high-pass filtering characteristics. The anticipated transmission loss may be calculated using known measurement techniques for determining signal strengths at frequencies within a particular frequency range. Alternatively, theoretical approximations may be used, particularly if there is only one type of loss (e.g., skin loss) that is considered in the approximation. A more practical alternative is to repeatedly adjust the equalization while monitoring the output jitter, and then select the equalization setting that provides the best results.

Figure 3:
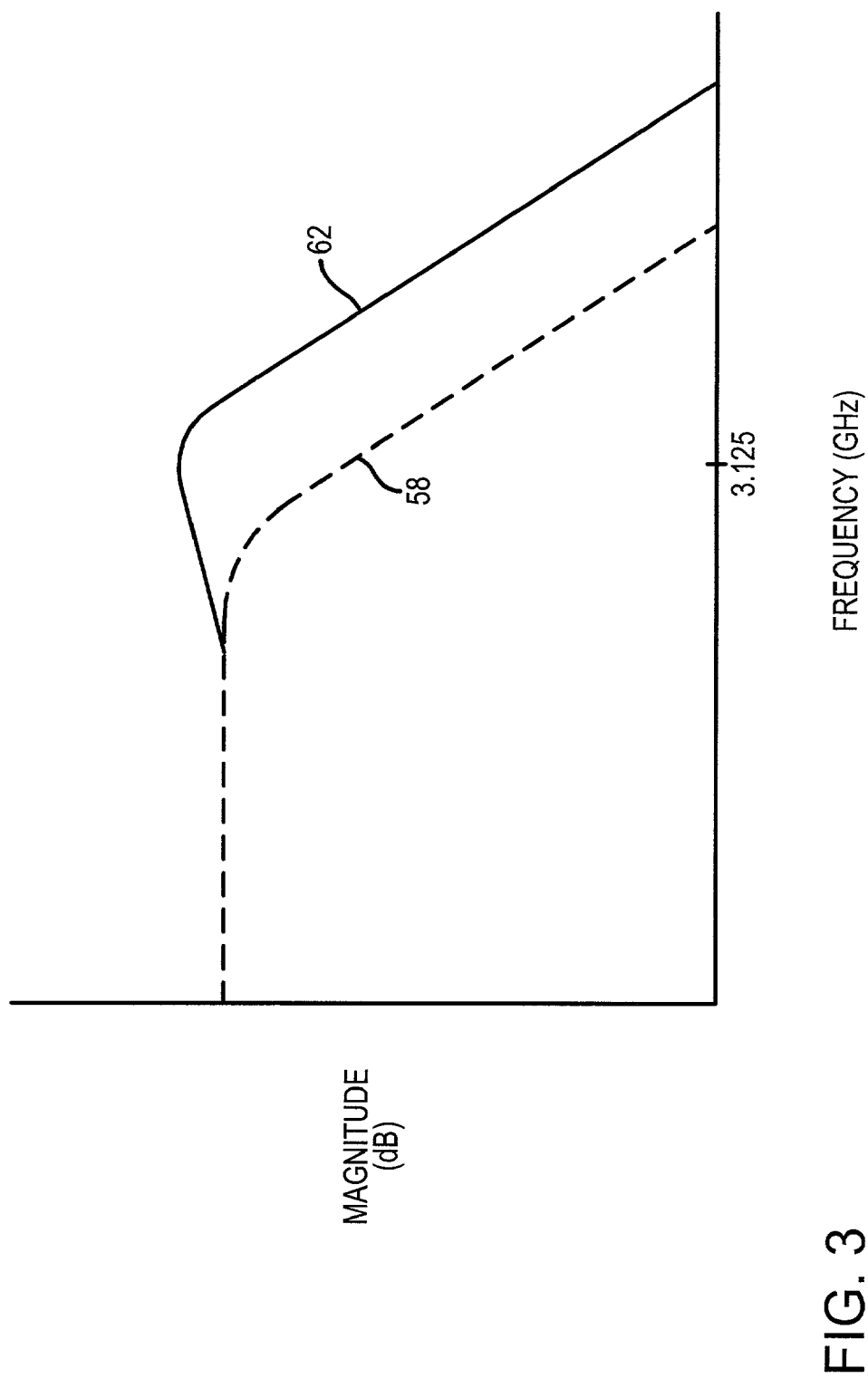
FIG. 3 is a plot showing an example of a low-pass frequency response of a transmission channel and a high-pass frequency response of a tailored equalization circuit of the type used in FIG. 1.

Skin loss varies with the type of channel medium, such as a copper trace, with the length of the channel medium, and with properties such as the width of the channel medium. Referring briefly to FIG. 3, a low-pass frequency response of an input channel is represented by dashed line 58. As can be seen, significant attenuation occurs at the high frequency end of the bandwidth. By characterizing the frequency response of the input channel, the equalization can be tailored to provide compensation for losses with minimum jitter at the output 60 of the input cell 28 of FIG. 2. The tailoring of the equalization provides high-pass filtering characteristics for a particular frequency range due to parasitic limitations, as represented by the solid line 62 in FIG. 3.

The resistance 54 and the capacitance 56 may represent fixed components that are individually designed for each input cell. This is the fixed, but tailored, equalization approach. On the other hand, in the fixed and uniform equalization approach, the values of the capacitance and resistance will be the same for all of the input cells. In the adjustable approach the values are user adjustable, while the adaptive approach enables automatic variations in the equalization level. As will be explained below, the adaptive approach may conserve chip space by combining functions for the various input cells.

Figure 4:
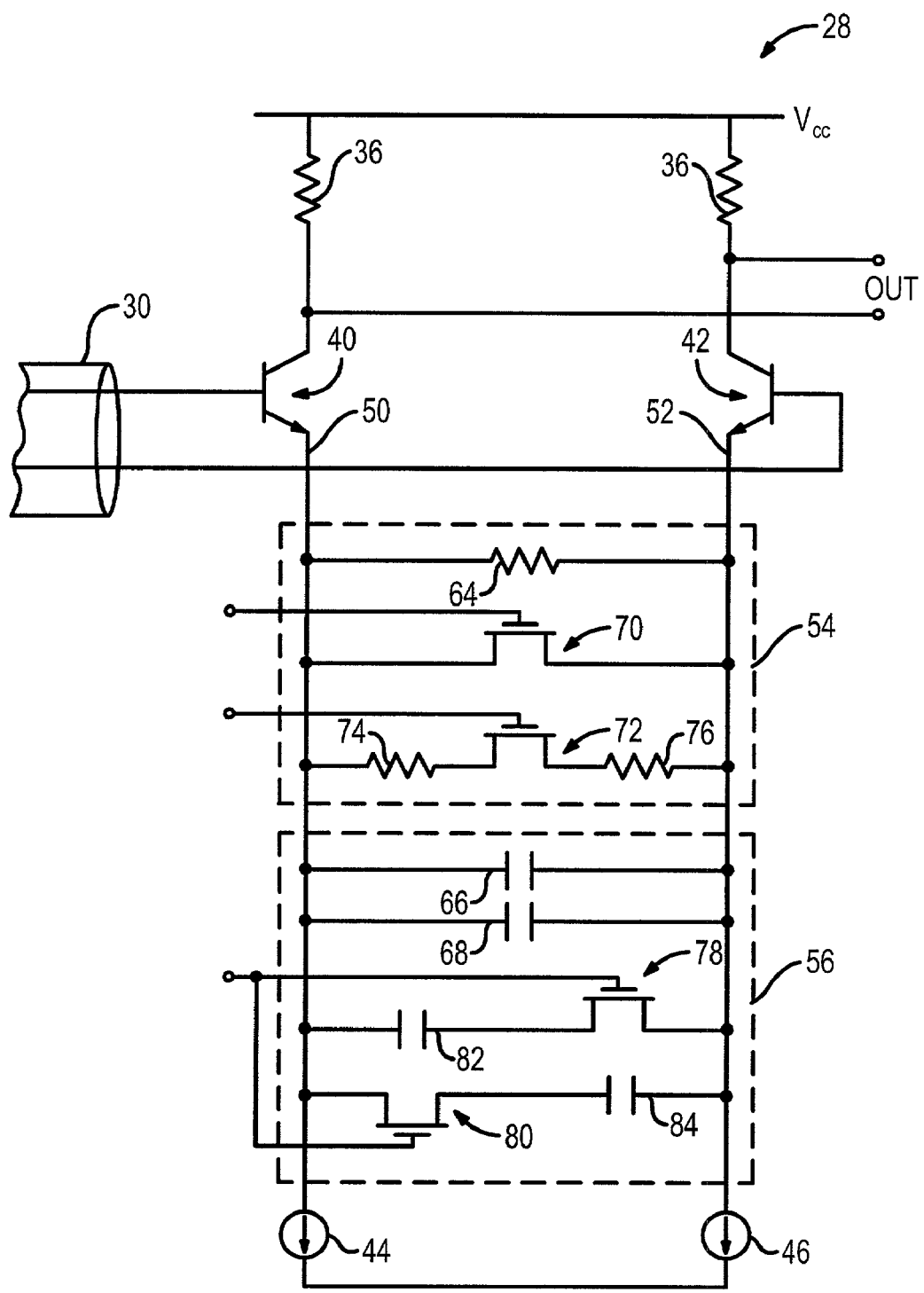
FIG. 4 is a schematic diagram of an embodiment for providing the adjustable equalization for the input cell of FIG. 2.

Referring now to FIG. 4, one implementation of the adjustable resistance 54 and the adjustable capacitance 56 (i.e., adjustable approach) is illustrated. In this embodiment, there is a default equalization by the fixed connections of a default resistor 64 and a pair of default capacitors 66 and 68 to the emitters 50 and 52 of the transistors 40 and 42 that form the drive circuitry for the input cell 28. As is known in the art, the parallel connection of resistors and capacitors may be used to provide high-frequency boost, such as represented by the solid line 62 in FIG. 3. For example, by providing appropriate "zeros" and "poles," the threshold level for the gain boost may be 2 GHz. Thus, a particular frequency range beyond 2 GHz will be amplified, to level the combined frequency responses of the input channel and the input cell 28 for the frequency range of interest.

While the default resistor 64 and the default capacitors 66 and 68 have fixed connections, the default components may be considered to be a first switched connection, since activation of an on/off MOS transistor 70 effectively removes the default components from the circuit. Activation of the transistor 70 shorts the emitters 50 and 52 of the transistors 40 and 42. The transistor has a small resistance that presents complete elimination of equalization, but the resistance is sufficiently small to ensure minimal effect of equalization on the operation of the input cell 28.

As is known in the art, the default components 64, 66 and 68 provide a first parallel-resonant circuit that establishes the default equalization. A second switched connection is formed by the combination of a switching transistor 72 and a pair of resistors 74 and 76. By activating the transistor 72, the resistors 74 and 76 are introduced into the equalization circuitry. The added resistors are in parallel with the default resistor 64, so that the total resistance of the equalization circuitry will decrease. A corresponding decrease in the boost provided by the equalization may be used to selectively tailor the filtering characteristics. Tailoring can also be achieved by selectively adding capacitance. Ganged switching transistors 78 and 80 may be used to selectively couple and decouple capacitors 82 and 84 to and from the adjustable equalization circuitry. While equalization improves signal integrity, the parasitic capacitance that is added will decrease the speed of the circuit. Thus, there is a tradeoff between equalization and circuit performance.

While the embodiment of FIG. 4 includes a number of different switched connections for varying both the resistance and the capacitance within the parallel-resonant arrangement of the equalization circuitry, a greater number of switched connections are preferably available within the equalization circuitry. The use of MOS transistors 70, 72, 78 and 80 is shown in FIG. 4, but other switching devices may be substituted. However, it is desirable to enable manipulation of the switching devices from the exterior of the integrated circuit chip which houses the input cell 28, as well as the other input cells. Also contemplated are embodiments in which equalization within a crosspoint switch is achieved without using switched connections, since resistances and capacitances may be adjusted using other techniques.

Table 1 identifies simulation jitter for 0 dB to 8.4 dB of skin loss, given different strengths of equalization. In generating Table 1, a simulation was performed at a data rate of 3.125 Gbits/sec, which has the fundamental frequency of 1.5625 GHz. Jitter was measured for the output of an input cell of a crosspoint switch, where the input cell included adjustable equalization. However, there were no package or test fixture models, so that the jitter measurements should be considered for relative comparison purposes only.

TABLE 1

| dB Loss | 0 | 1 | 2 | 3 | 4 | 5 | 6 | 7 |
|---|---|---|---|---|---|---|---|---|
| 0 | 2.2 ps | 4.4 ps | 7.8 ps | 10.6 ps | 13.2 ps | 15.3 ps | 18.4 ps | 21.7 ps |
| 1.4 | 2.7 ps | 1.4 ps | 2.4 ps | 5.8 ps | 8.9 ps | 11.3 ps | 14.3 ps | 16.9 ps |
| 4.2 | 15.1 ps | 8.4 ps | 4.6 ps | 1.8 ps | 5.3 ps | 9.6 ps | 13.4 ps | 17.8 ps |
| 8.4 | 78.9 ps | 47.3 ps | 32.8 ps | 22.2 ps | 13.2 ps | 5.7 ps | 6.7 ps | 16.3 ps |

The input cell for generating Table 1 allowed eight levels of equalization. In Table 1, the levels are number 0 to 7, with the higher numbers indicating a greater level of equalization. However, the incrementation is not necessarily symmetric. That is, the numbers 0 to 7 do not have significance beyond indicating the relative level of equalization. Referring briefly to FIG. 4, the 0 level of equalization would be a situation in which the on/off transistor 70 is activated, shorting the emitters 50 and 52 of the transistors 40 and 42. Other levels of equalization would include the default configuration in which all of the switching transistors 70, 72, 78 and 80 are deactivated. However, FIG. 4 does not allow eight different levels of equalization.

In Table 1, the row for 0 dB loss shows that over equalization adds jitter, so that the preferred setting is 0 equalization. However, reviewing the column associated with 0 level equalization, it can be seen that the jitter increases rapidly as skin loss is increased. Looking to the other seven columns, jitter is not eliminated by the adjustable equalization, but jitter can be controlled by properly selecting the level of equalization, given an amount of skin loss.

Figure 5:
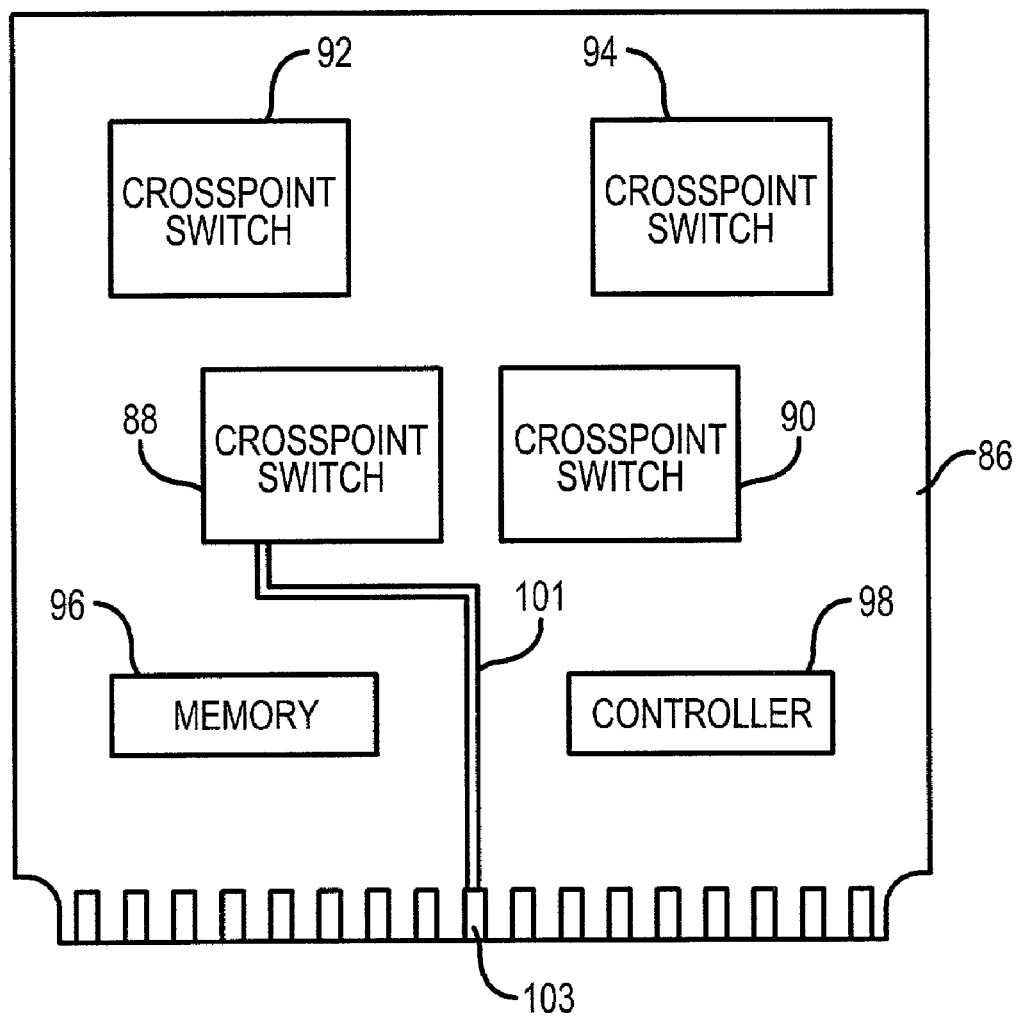
FIG. 5 is a top view of a printed circuit board having an array of crosspoint switches of FIG. 1.

Referring now to FIG. 5, a printed circuit board 86 is shown as having four crosspoint switches 88, 90, 92 and 94. The printed circuit board also includes a memory chip 96 and a controller chip 98. The controller chip provides the various signals for operating the crosspoint switches. Thus, for each of the crosspoint switches, the controller chip communicates with the control register 26 of FIG. 1 to program the input equalization, the output amplitude and the power on/off settings for each input port and output port of the crosspoint switch. The memory chip 96 stores the various settings for the different switches, including the equalization settings.

Figure 6:
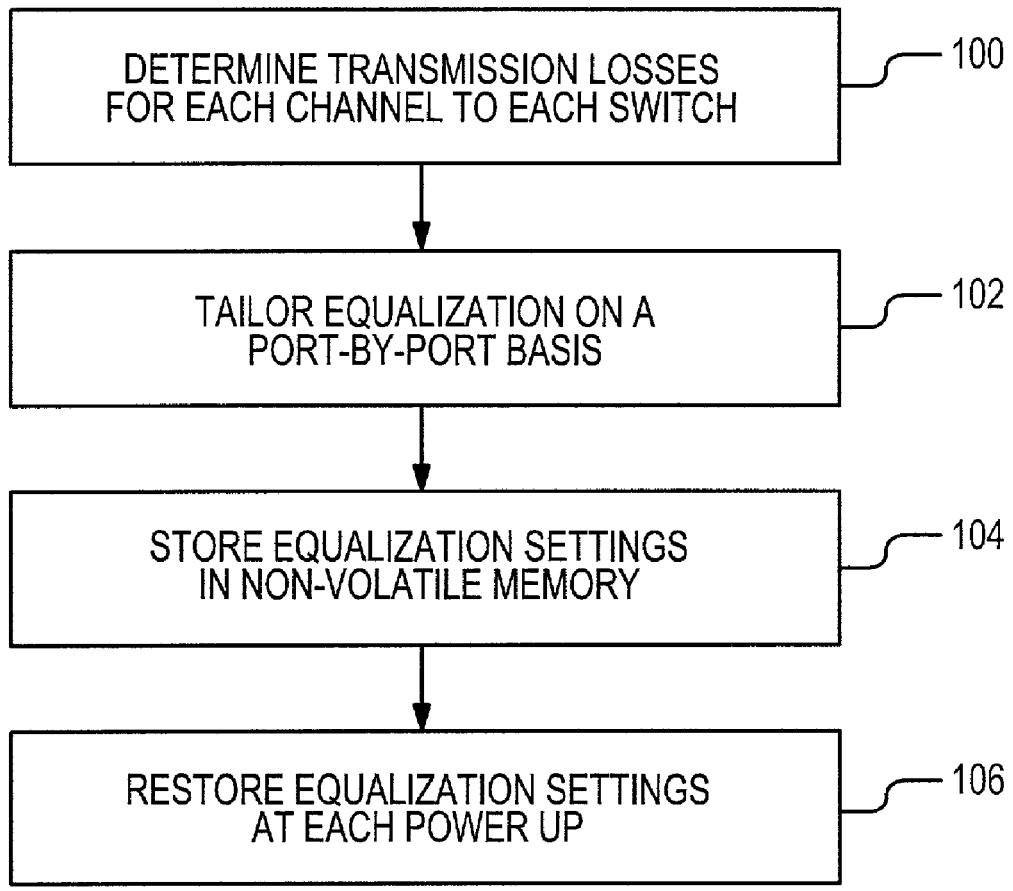
FIG. 6 shows a process flow of steps for setting up the crosspoint switches of FIG. 5.

In the setup procedure for the printed circuit board 86, the transmission loss for each channel is determined, as indicated by step 100 in FIG. 6. This is typically a one-time procedure. The transmission losses of concern are those losses that are frequency dependent, such as skin loss. In FIG. 5, a single copper trace 101 is included to show one connection of an input port of the first stage switch 88 to an edge connection 103 of the board 86. While not shown, similar connections are made to other ports. The distances that signals must travel from their sources to the different input ports of the different switches 88, 90, 92 and 94 will vary. As a result, the skin losses for the same signal at the different input ports will be different. Variations in lengths of traces also occur for the input channels to the first stage switch. In the execution of step 100, skin loss is determined for each channel of each crosspoint switch. Measurement techniques may be used or skin loss can be estimated on the basis of prior experience with the channel medium (copper traces) at different lengths. Alternatively, jitter at the output port can be monitored while the available equalizations are tried in turn, with the results being used to select the equalization.

In step 102, the equalization is tailored for each crosspoint switch 88, 90, 92 and 94, with the equalization tailoring being on a port-by-port basis. Other than when using the adaptive equalization approach, this is a one-time step. In a costly approach to the invention, the tailoring of equalization occurs at the fabrication stage. That is, a crosspoint switch is fabricated to provide equalization that varies among the ports. However, cost and complexity are both reduced by providing adjustable equalization circuitry, such as represented in FIG. 2 and shown in FIG. 4. As another variation on the invention, the output ports may have tailored equalization, rather than the input ports. However, output equalization (or pre-emphasis) increases power dissipation significantly, so that input equalization is preferably in many applications.

At step 104, the equalization settings are stored in non-volatile memory, such as memory 96 in FIG. 5. For example, in the adjustable equalization circuitry of FIG. 4, the settings determine which of the four switching transistors 70, 72, 78 and 80 are activated and which transistors are deactivated. At step 106, the system is initialized and equalization settings are loaded into the crosspoint switches. This occurs at each power up situation. In FIG. 5, the equalization settings stored in memory chip 96 are accessed by the controller chip 98 and are used to provide the target equalization at each equalized port of the different switches 88, 90, 92 and 94.

Figure 7:
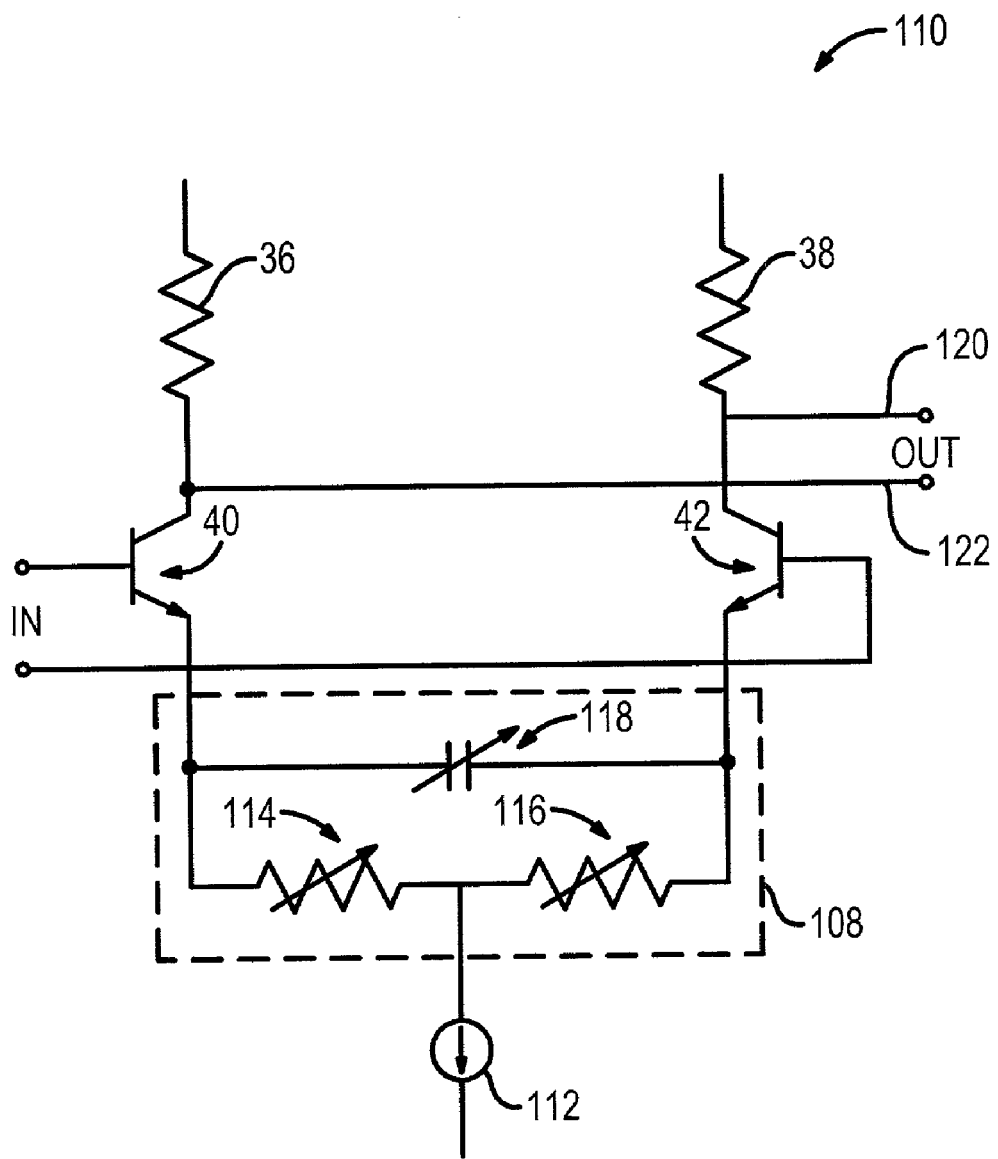
FIG. 7 is a schematic diagram of a second embodiment of an equalized input cell of FIG. 1.

FIG. 7 illustrates an alternative embodiment of adjustable equalization circuitry 108 for use in tailoring equalization. As compared to the input cell 28 of FIG. 2, the input cell 110 of FIG. 7 utilizes a single current source 112, with two variable resistances 114 and 116 in parallel with a variable capacitance 118. Optionally, the two variable resistances 114 and 116 are "ganged," so that they are varied uniformly. However, uniform variations to the two resistances is not significant in many applications. The implementations of the variable resistances and capacitances are consistent with the approach described with reference to FIG. 4. Thus, switching devices, such as transistors, are selectively activated and deactivated to achieve a target level of equalization. While the circuitry of FIGS. 2, 4 and 7 have been identified as being input cells, the tailored equalization may be provided at an output cell. Thus, the output lines 120 and 122 of FIG. 7 may be connected to output channel lines.

Figure 8:
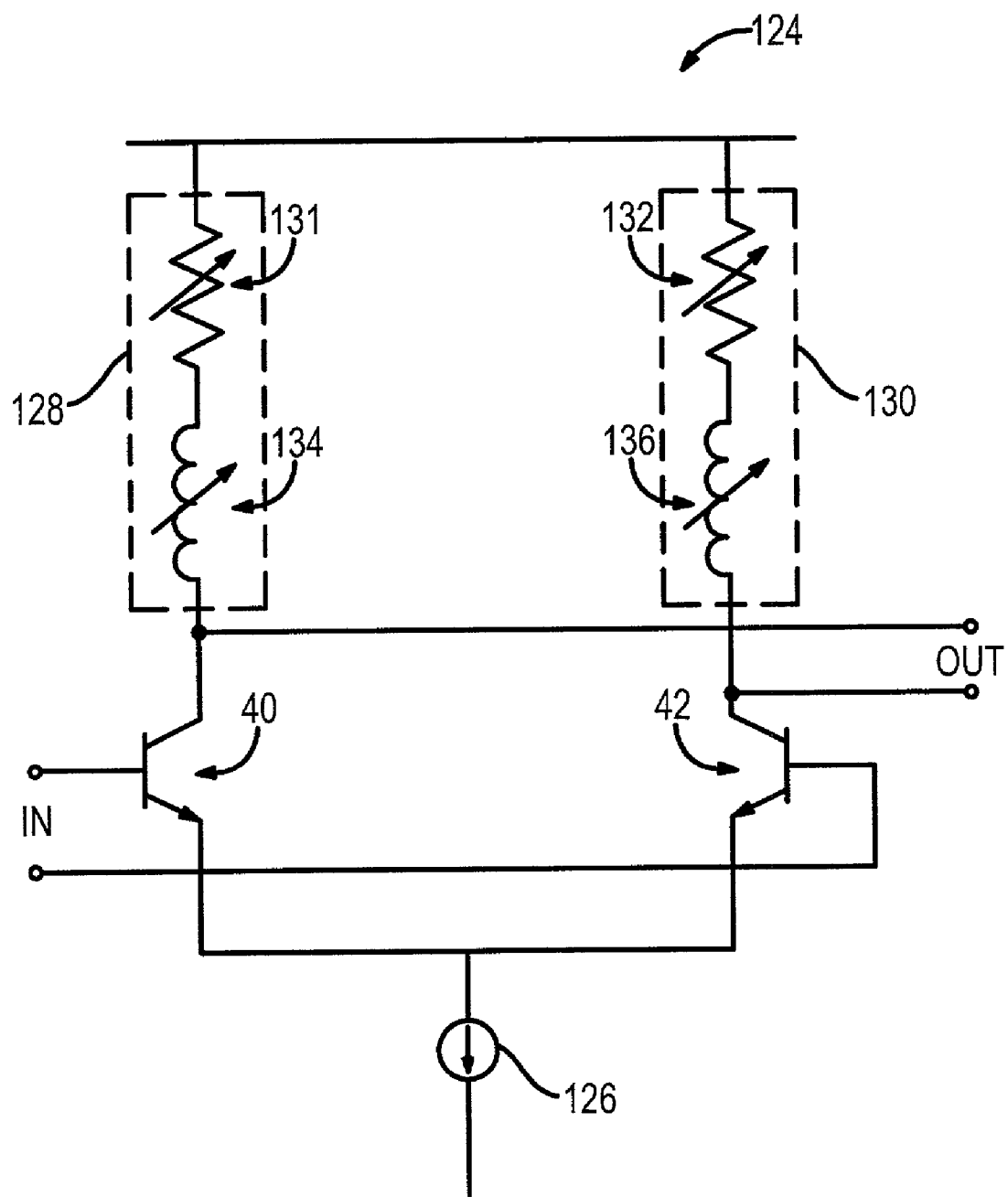
FIG. 8 is a schematic diagram of a third embodiment of an equalized input cell of FIG. 1.

As another alternative, the parallel resonant circuits of FIGS. 2, 4 and 7 may be replaced with a series resonant circuit that provides equalization. Referring to FIG. 8, an equalized circuit 124 includes driver circuitry and includes equalization circuitry. The driver circuitry is a differential amplifier provided by transistors 40 and 42. The emitters of the transistors are connected to a current source 126. Each collector is connected to a series resonant circuit 128 and 130 to provide the tailored equalization. Adjustable series resonance is achieved by connecting a variable resistance 131 and 132 to a variable inductance 134 and 136. Switched connections of resistances and inductances are coupled and decoupled on the basis of providing a target equalization capacity. The switched connections may be controlled by activating and deactivating transistors, in the manner described with reference to FIG. 4. Thus, a number of resistive switched connections may be placed in parallel, with the parallel resistances being added in order to decrease total resistance or being decoupled in order to increase total resistance. The same technique may be used for the inductance or the adjustments may be made by selectively shorting sections of an inductor.

Figure 9:
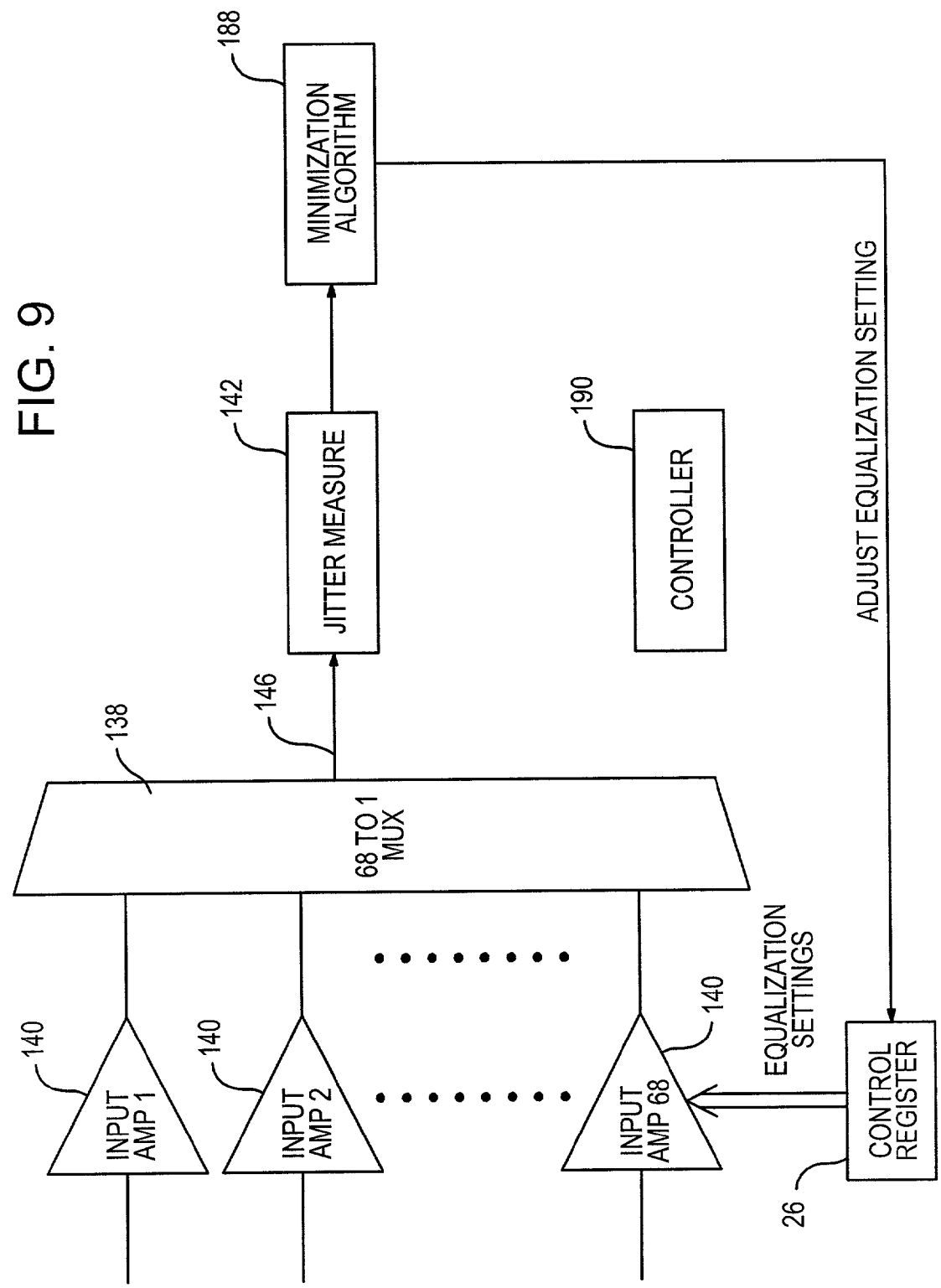
FIG. 9 is a block diagram of an adaptive equalization approach in accordance with the invention.

FIG. 9 illustrates one embodiment of adaptive equalization for use in the crosspoint switch 10 of FIG. 1. The adaptive equalizer automatically adjusts the equalization setting, so that an advantage over the adjustable equalizer is that less user intervention is required to reach a target setting. Moreover, adaptive equalization tracks changes in the environment or in the supported hardware. However, it is believed that changes in temperature, IC processing, and supply voltages have minimal effect on the optimal equalization setting. Under normal conditions, there is likely to be only a difference of one in the equalization setting for the implementation of Table 1. Since the hardware connected to the input channels does not change regularly, the adjustable equalization that was described above operates well with its single setting, but cannot track the one-setting differences that may occur without requiring the user to periodically check jitter. Adaptive equalization can also determine the optimal equalization setting upon installation of new hardware, reducing the amount of user intervention A concern with adaptive equalization within the same IC package as the switch matrix of a crosspoint switch is that adaptive equalization at each port may require a significant portion of the total IC chip real estate. Conventionally, adaptive equalization circuitry is complex and would be too large to repeat the circuitry for each input channel. However, in the embodiment shown in FIG. 9, a multiplexer 138 is used to multiplex all of the input channels, so that the adaptive process may be performed one channel at a time. As a result, a single adaptive arrangement may be used for all of the input channels. The multiplexer 138 may be of the same type used within the switch matrix. Thus, in a crosspoint switch having 68 output channels, there will be 69 multiplexers.

The multiplexer 138 receives a signal from each of the input amplifiers 140 connected to an input channel. The multiplexed output signal is directed to a jitter measurement component 142. Jitter measurement is a difficult task in the implementation of the adaptive equalization approach. One possible solution is to use a phase locked loop (PLL) to provide jitter measurement. A bang—bang PLL is well suited for this application, since it is digital and will interface easily to other digital circuitry. However, a linear PLL may also work by using its phase-error information. The bang—bang PLL is described for retiming (rather than equalization) in a publication entitled "A Monolithic 622 MB/s Clock Extraction Data Retiming Circuit," by Benny Lai et al., 1991 *IEEE International Solid-State Circuits Conference* (91CH2960-3/91/0000-0144).

Figure 10:
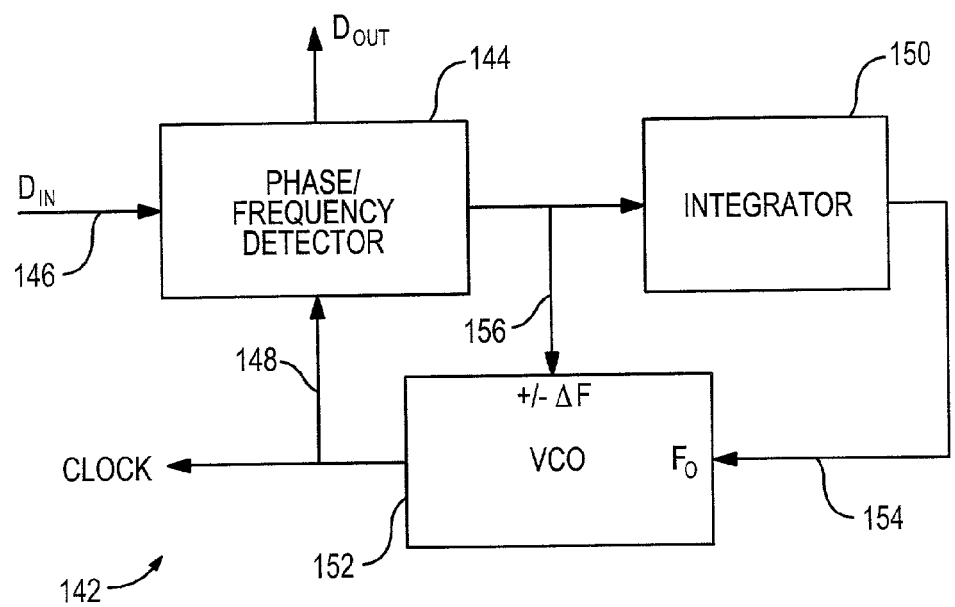
FIG. 10 is a block diagram of one implementation of the jitter measurement component of FIG. 9.

The overall circuit of the bang—bang PLL is comprised of three main components, as shown in FIG. 10. The first component is a phase/frequency detector 144, which compares non-return-to-zero (NRZ) data $D_{IN}$ 146 to a clock input 148. In response, the detector 144 produces a binary output. In addition, a built-in decision circuit retimes the data input $D_{IN}$ in the center of the data eye.

The second component is a charge pump integrator 150 which integrates the detector output. The clock is generated by the third component, which is a specially designed voltage controlled oscillator (VCO) 152. One input 154 of the VCO sets the center frequency (Fo) and another input 156 toggles the VCO between two small but discrete frequency offsets. The output of the detector 144 controls the toggling. The output of the integrator 150 sets the center frequency of the VCO.

Figure 11:
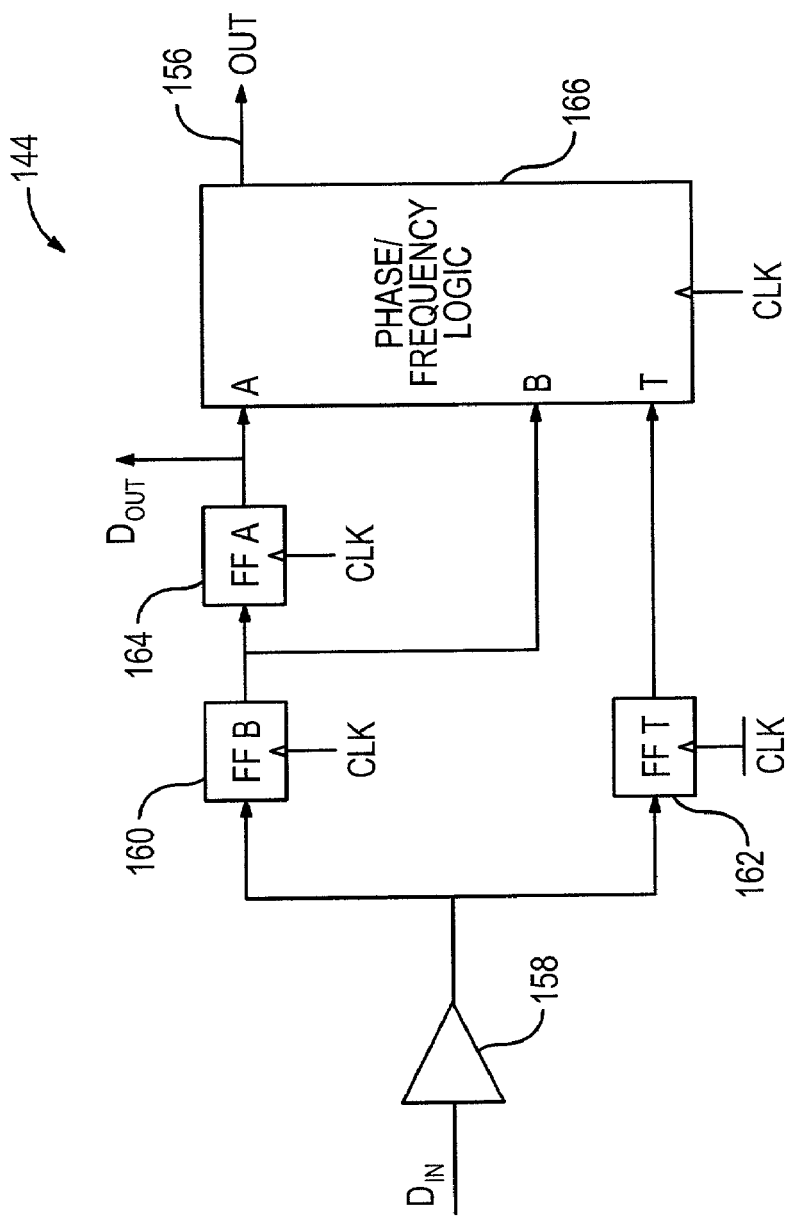
FIG. 11 is a block diagram of the phase/frequency detector of FIG. 10.

The block diagram of the phase/frequency detector 144 is shown in FIG. 11. The data input $D_{IN}$ is first split from an input buffer 158 into flip-flop B 160 and flip-flop T 162. The output of flip-flip B feeds flip-flop A 164. Both flip-flop A and flip-flop B are toggled by clock CLK, while flip-flop T is toggled by $\overline{CLK}$. This results in the sampling of the input data at three distinct points, i.e., prior to, in the vicinity of, and following each potential data transition. If a data transition is present, the phase relationship of the data and the clock can be deduced by phase/frequency logic 166 to be either fast or slow. The phase detector output is combined with that of a frequency detector, which yields the final detector output 156.

Figure 12:
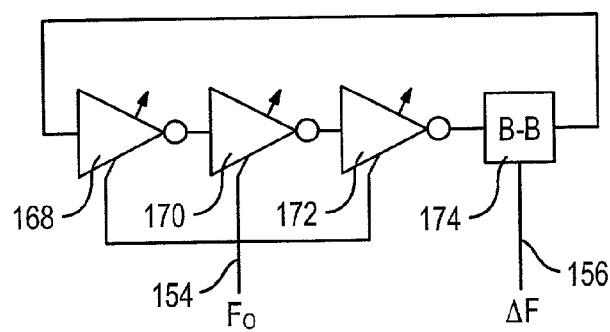
FIG. 12 is a block diagram of the components of the voltage controlled oscillator of FIG. 10.
Figure 14:
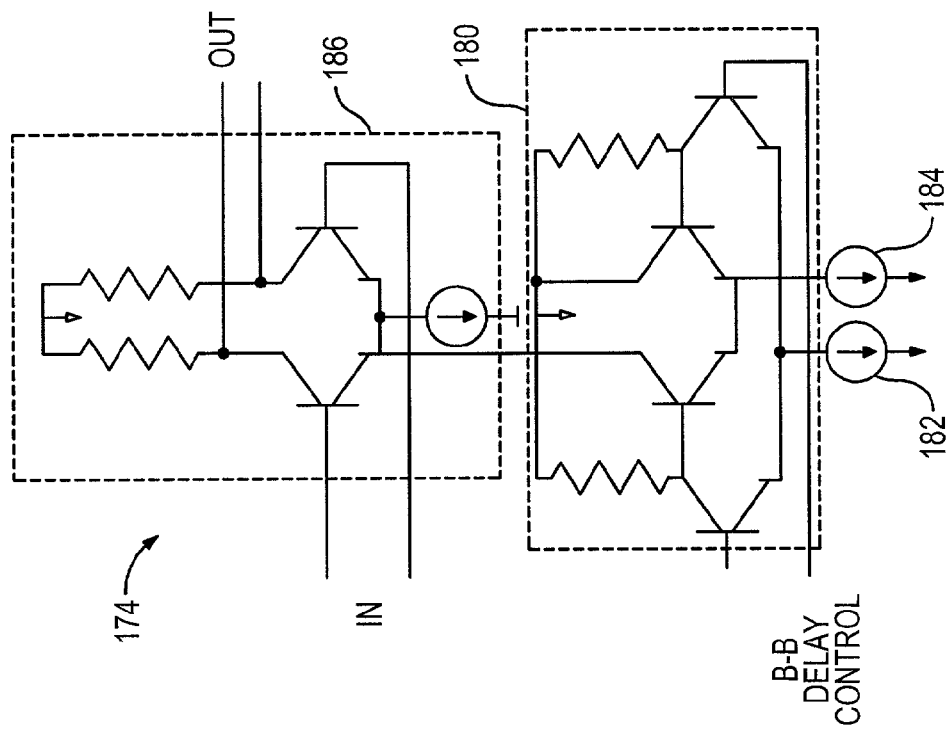
FIGS. 13 and 14 are schematic diagrams of the voltage controlled ring oscillator of FIG. 12.
Figure 13:
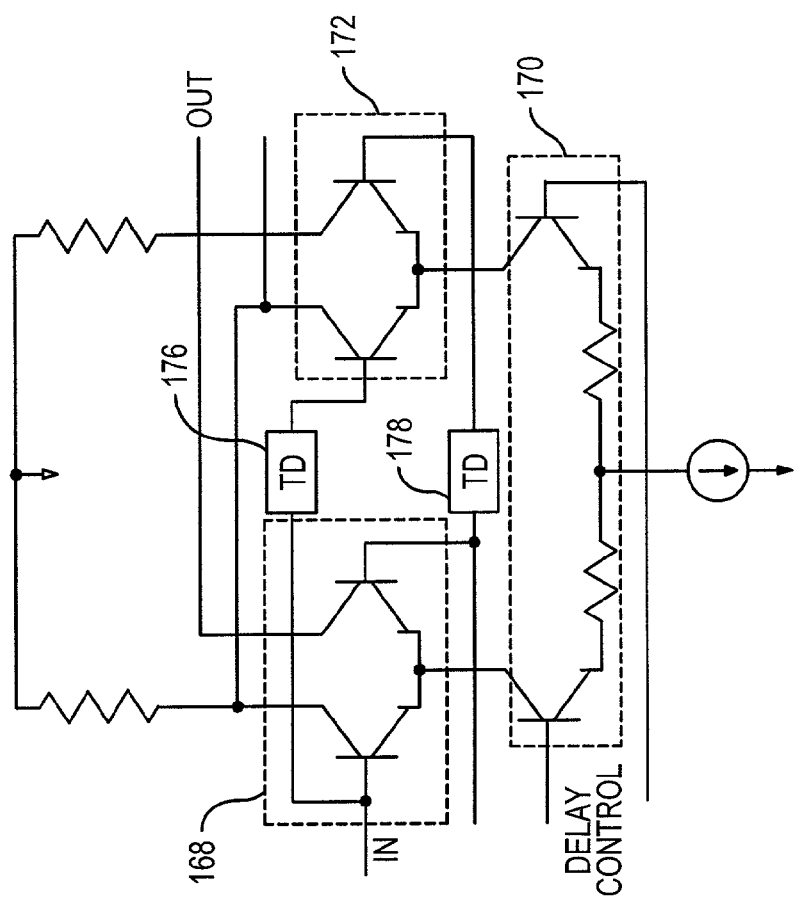

The VCO 152 of FIG. 10 may be designed with a ring oscillator, such as the one illustrated broadly in FIG. 12 and in greater detail in FIGS. 13 and 14. The ring oscillator consists of three variable-delay cells 168, 170 and 172 and a bang—bang delay cell 174. The bang—bang delay cell provides an additional small delay inserted upon command, which is received as the signal 156 from the phase/frequency detector 144.

The variable delay cell 170 provides a continuous interpolation between the two cells 168 and 172 of different time delays 176 and 178. The analog inputs to these variable-delay cells form the center frequency control for the VCO 152 of FIG. 10. On the other hand, the bang—bang delay cell 174 is designed with three sections. One section 180 has a digital delay control and is used to adjust gain by adjusting bias current presented by current devices 182 and 184. The digital input of the bang—bang delay cell 174 is sliced to a lower level. This voltage is then converted into current with a transconductance cell 186, which modulates the bias current of the buffer to be biased below the peak current.

While not shown in FIG. 10, the integrator 150 requires capacitors, which are typically off-chip capacitors. In operation, the phase/frequency detector 144 generates "up" or "down" commands that instruct the VCO 152 to increase or decrease in speed, so as to track the incoming signal. In FIG. 11, if the output state ("0" or "1") of the flip-flop A 164 is the same as the output state of flip-flop T 162, a speed up command will be generated. On the other hand, if the output states of the two flip-flops 162 and 164 are different, a slow down command will be generated. The up and down commands may be converted into a jitter measure and then used by a conventional error-minimization algorithm component 188 in FIG. 9 to minimize the measured jitter by adjusting the equalization setting. Basically, what is necessary is to find the equalization setting with the lowest measured jitter. This can be done through an extensive search or through a sequence of changing the equalization setting to determine whether jitter within the output signal increases or decreases, so that an adjustment may be made accordingly. The user can choose to selectively optimize a specific channel or let a built-in controller 190 optimize all of the input channels that are powered "on" in a one-by-one sequence.

Technically, the up and down commands do not directly identify the amount of jitter within the signal. Rather, processing is necessary to measure the jitter. The bang—bang PLL described above yields the up and down commands at each data transition, allowing the VCO 152 to determine whether the data transition is before or after the VCO clock edge. With this information, the VCO attempts to align the clock edge with the data transitions. Eventually, the VCO clock edge follows the data transition directly. Thus, it is possible to determine the amount of time jitter within the signal. This may be performed simply by counting the number of consecutive up and down commands, or a more complex algorithm may be used to perform some digital filtering to determine the amplitude of standard deviation of the swing. In either case, it is necessary to wait for the PLL to lock before taking the measurement, and the measurement must be taken over a period of time to ensure that some variations (i.e., differences in the number of consecutive zeros or ones) in the incoming signal occur, since if there are no variations there will be no jitter to minimize. A mechanism may be included to ensure that there are data transitions before a jitter measurement is yielded, since data transitions are by nature unpredictable.

The bang—bang PLL is similar to a 1-bit analog-to-digital converter and has bandwidth limitations. Therefore, there may be other techniques that generate more accurate measurements of jitter. Since the up and down commands yield only directional information, a measure of the position in time of the data transitions would provide wider-band information on the jitter. However, such a circuit would likely be more complex. One possible method would be to take multiple samples at a time to be able to quantify, at least to a certain extent, the distance that data transitions are from clock edges. The controller 190 of FIG. 9 is included to allow the multi-step process of reducing jitter. The controller could be used to interface with a user in order to optimize one channel, all "on" channels, or no channels. The controller could be used to select the appropriate channel, read the present equalization setting, wait for the PLL to lock, and take the jitter measurement after waiting the appropriate time. Then, the controller would be able to increase or decrease the equalization setting in accordance with the minimization algorithm.

What is claimed is:

1. A crosspoint switch integrated circuit comprising:
an array of input ports;
an array of output ports;
a switch matrix configured to selectively connect said input ports to said output ports for conducting electrical signals therebetween; and
equalization circuitry coupled to at least partially offset transmission losses experienced by said electrical signal while external to said crosspoint switch integrated circuit, said equalization circuitry being configured to measure jitter within said electrical signals and to utilize jitter measurements as a basis for offsetting said transmission losses, said equalization circuitry being responsive to said jitter measurements to automatically select levels of equalization;
wherein said equalization circuitry is configured to recurringly execute said jitter measurements and recurringly execute responsive selection of said levels of equalization for individual said input ports, thereby enabling said levels of equalization to track variations in said transmission losses.

2. The crosspoint switch integrated circuit of claim 1 wherein said equalization circuitry includes a plurality of adjustable equalizers, said adjustable equalizers each having adjustable filtering characteristics within a fixed number of equalization settings.

3. The crosspoint switch integrated circuit of claim 2 wherein each said adjustable equalizer includes a plurality of switchable connections which individually adjust said filtering characteristics when activated.

4. The crosspoint switch integrated circuit of claim 3 wherein each said switchable connection includes a switch, at least some of said switchable connections including at least one component which significantly affects said filtering characteristics when said switchable connections are individually activated.

5. The crosspoint switch integrated circuit of claim 4 wherein at least some of said switchable connections are arranged in electrical parallel and said components include capacitors and resistors.

6. The crosspoint switch integrated circuit of claim 4 wherein at least some of said switchable connections are arranged in electrical parallel and said components include an inductor and a resistor.

7. The crosspoint switch integrated circuit of claim 4 wherein said switches are transistors and said components include at least some of resistors, capacitors, or inductors.

8. The crosspoint switch integrated circuit of claim 3 wherein adjustable equalizers are coupled to said input ports in one-to-one correspondence.

9. The crosspoint switch integrated circuit of claim 1 wherein said equalization circuitry includes a multiplexer connected to a jitter measurement component for providing said jitter measurements, said multiplexer being connected to receive said electrical signals from each of said input ports and being operatively associated with said jitter measurement component to enable said jitter measurements on a port-by-port basis.

10. The crosspoint switch integrated circuit of claim 9 wherein said jitter measurement component includes a phase-locked loop for tracking data transactions within said electrical signals, said jitter measurement component further including a voltage-controlled oscillator connected to be responsive to operations of said phase-locked loop.

11. A method of providing equalization for a crosspoint switch formed on an integrated circuit chip comprising:
determining signal characteristics related to signal transmissions via each of a plurality of ports of said crosspoint switch, including providing on-chip measurements of jitter of electrical signals, wherein said jitter is induced by off-chip conditions; and setting equalization circuitry housed within said crosspoint switch such that each said port has filtering characteristics tailored on a basis of said signal characteristics for said signal transmissions via said each port, said setting including activating adaptive equalization circuitry, said setting being automated and being at least partially based on said on-chip measurements of jitter.

12. The method of claim 11 wherein said step of setting includes selectively activating and deactivating switching devices which introduce parallel connections of resistances and capacitances within said equalization circuitry, said equalization circuitry being a plurality of adjustable equalization circuits.

13. The method of claim 11 wherein said step of setting includes selectively activating and deactivating switching devices which introduce series connections of resistances and inductances within said equalization circuits.

* * * * *